(12) United States Patent
Serbetli et al.

(10) Patent No.: US 10,644,837 B2
(45) Date of Patent: May 5, 2020

(54) SIGNAL PROCESSING WITH ERROR CORRECTION

(71) Applicant: NXP B.V., Eindhoven (NL)

(72) Inventors: Semih Serbetli, Eindhoven (NL); Nur Engin, Eindhoven (NL)

(73) Assignee: NXP B.V., Eindhoven (NL)

( * ) Notice: Subject to any disclaimer, the term of this patent is extended or adjusted under 35 U.S.C. 154(b) by 127 days.

(21) Appl. No.: 16/051,903

(22) Filed: Aug. 1, 2018

(65) Prior Publication Data

US 2020/0044775 A1 Feb. 6, 2020

(51) Int. Cl.
*H04L 1/00* (2006.01)
*H03M 13/29* (2006.01)
*H03M 13/37* (2006.01)

(52) U.S. Cl.
CPC ...... *H04L 1/0064* (2013.01); *H03M 13/2936* (2013.01); *H03M 13/2939* (2013.01); *H03M 13/3776* (2013.01); *H04L 1/0054* (2013.01); *H04L 1/0057* (2013.01); *H04L 1/0059* (2013.01); *H04L 1/0061* (2013.01); *H04L 1/0065* (2013.01); *H04L 1/0071* (2013.01)

(58) Field of Classification Search
CPC ... H04L 1/0064; H04L 1/0057; H04L 1/0061; H04L 1/0071; H04L 1/0054; H04L 1/0059; H04L 1/0065; H03M 13/2936; H03M 13/2939; H03M 13/3776
USPC ......... 714/755, 786, 795, 794; 375/262, 341
See application file for complete search history.

(56) References Cited

U.S. PATENT DOCUMENTS

| | | | | |
|---|---|---|---|---|
| 5,815,099 A | * | 9/1998 | Gledhill | H04L 27/2332 341/94 |
| 6,606,724 B1 | | 8/2003 | Krieger et al. | |
| 6,912,685 B2 | * | 6/2005 | Takeda | H03M 13/136 370/342 |
| 7,526,711 B2 | * | 4/2009 | Orio | H03M 13/2975 714/755 |
| 7,577,893 B2 | | 8/2009 | Song et al. | |
| 7,584,409 B2 | * | 9/2009 | Orio | H03M 13/2975 714/796 |
| 7,783,963 B2 | | 8/2010 | Huggett et al. | |
| 2002/0147954 A1 | * | 10/2002 | Shea | H03M 13/098 714/755 |

(Continued)

OTHER PUBLICATIONS

Mohammed et al, Design and Implementation Different Types of Turbo Decoder with Various Parameters, May 2017, International Journal of Computer Applications, vol. 166—No. 11, pp. 44-48. (Year: 2017).*

(Continued)

*Primary Examiner* — John J Tabone, Jr.

(57) ABSTRACT

Aspects of the present disclosure are directed to decoding signals susceptible to communication errors. As may be implemented in accordance with one or more embodiments, an input signal is decoded to produce a first decoded output, which is subsequently encoded, and error characteristics of the encoded first decoded output are assessed. The input signal is again decoded (e.g., with a delay), using the encoded first decoded output and the assessed error characteristics thereof to assess a reliability characteristic of bits in the input signal. A second decoded output is then provided with errors corrected therein based on the assessed reliability characteristic.

20 Claims, 4 Drawing Sheets

(56) References Cited

U.S. PATENT DOCUMENTS

| | | | |
|---|---|---|---|
| 2003/0028838 A1* | 2/2003 | Chang | H03M 13/2957 714/755 |
| 2006/0085719 A1* | 4/2006 | Orio | H03M 13/2975 714/755 |
| 2006/0168500 A1* | 7/2006 | Whinnett | H04L 1/005 714/794 |
| 2006/0242547 A1* | 10/2006 | Maiuzzo | H03M 13/154 714/795 |
| 2006/0253769 A1* | 11/2006 | Orio | H03M 13/2975 714/796 |
| 2010/0083072 A1* | 4/2010 | Prasad | H03M 13/271 714/762 |
| 2012/0030538 A1 | 2/2012 | Maluzzo et al. | |
| 2015/0318873 A1 | 11/2015 | Oren et al. | |

OTHER PUBLICATIONS

Sah, Iterative Decoding of Turbo Codes, 2017, Journal of Advanced College of Engineering and Management, vol. 3, pp. 15-30. (Year: 2017).*

S. Scholl and N. Wehn, Hardware implementation of a Reed-Solomon soft decoder based on information set decoding, Design, Automation & Test in Europe Conference & Exhibition (DATE) 2014 Conference.

O. Aitsab and R. Pyndiah, Performance of concatenated Reed-Solomon/convolutional codes with iterative decoding, IEEE Global Telecommunications Conference (GLOBECOM) 1997.

* cited by examiner

SIGNAL PROCESSING WITH ERROR CORRECTION

OVERVIEW

Various aspects of the present disclosure are directed to signal processing apparatuses and methods, involving error correction.

A variety of signal communication approaches are utilized, in a multitude of applications. Such communication approaches are generally susceptible to noise and other error-type conditions, such that error correction is useful for improving the signal communication. Such error correction may involve checking certain signals or aspects of signals for accuracy, and performing error correction where applicable.

One type of error correction involves the use of convolutional codes, which facilitate relatively simple decoding and error correcting, and can be used in many wired and wireless communications standards. Such correction codes can be combined with other codes, using an interleaver, to provide concatenated codes. For instance, concatenated convolutional codes and Reed-Solomon (RS) codes can be utilized to address burst errors, such as by spreading the burst errors with an interleaver and then correcting the errors with RS codes. For instance, an input Viterbi decoder can be used for concatenated convolutional decoding and a hard input-hard output RS decoding can be used for RS decoding.

While various error correction approaches have been useful, challenges to their implementation remain. For instance, various approaches rely upon reliability information and ordered statistics, or may otherwise be quite complex, and have had limited usefulness. Further, many approaches require hardware and/or software changes.

These and other matters have presented challenges to signal processing, for a variety of applications.

SUMMARY

Various example embodiments are directed to signal processing with error correction via iterative decoding.

As may be implemented in connection with one or more aspects of this disclosure, an input signal is decoded, via logic circuitry, to produce a first decoded output, which is subsequently encoded. Error characteristics of the encoded first decoded output are then assessed. The input signal is again decoded, using the encoded first decoded output and the assessed error characteristics thereof to assess a reliability characteristic of bits in the input signal. A second decoded output is then provided with errors corrected therein based on the assessed reliability characteristic.

In accordance with various aspects of the disclosure, an apparatus for decoding signals susceptible to communication errors includes first and second decoder circuits, an encoder circuit, and logic circuitry for assessing error characteristics. The first decoder circuit includes logic circuitry configured and arranged to decode an input signal and produce a first decoded output therefrom, and the encoder circuit is configured and arranged to encode the first decoded output. The logic circuitry is configured and arranged to assess error characteristics of the encoded first decoded output. The second decoder circuit is configured and arranged to decode the input signal by using the encoded first decoded output and the assessed error characteristics thereof to assess a reliability characteristic of bits in the input signal. The second decoder circuit is further configured and arranged to produce a second decoded output having errors corrected therein based on the assessed reliability characteristic.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description and in connection with the accompanying drawings, in which.

Figure 1:
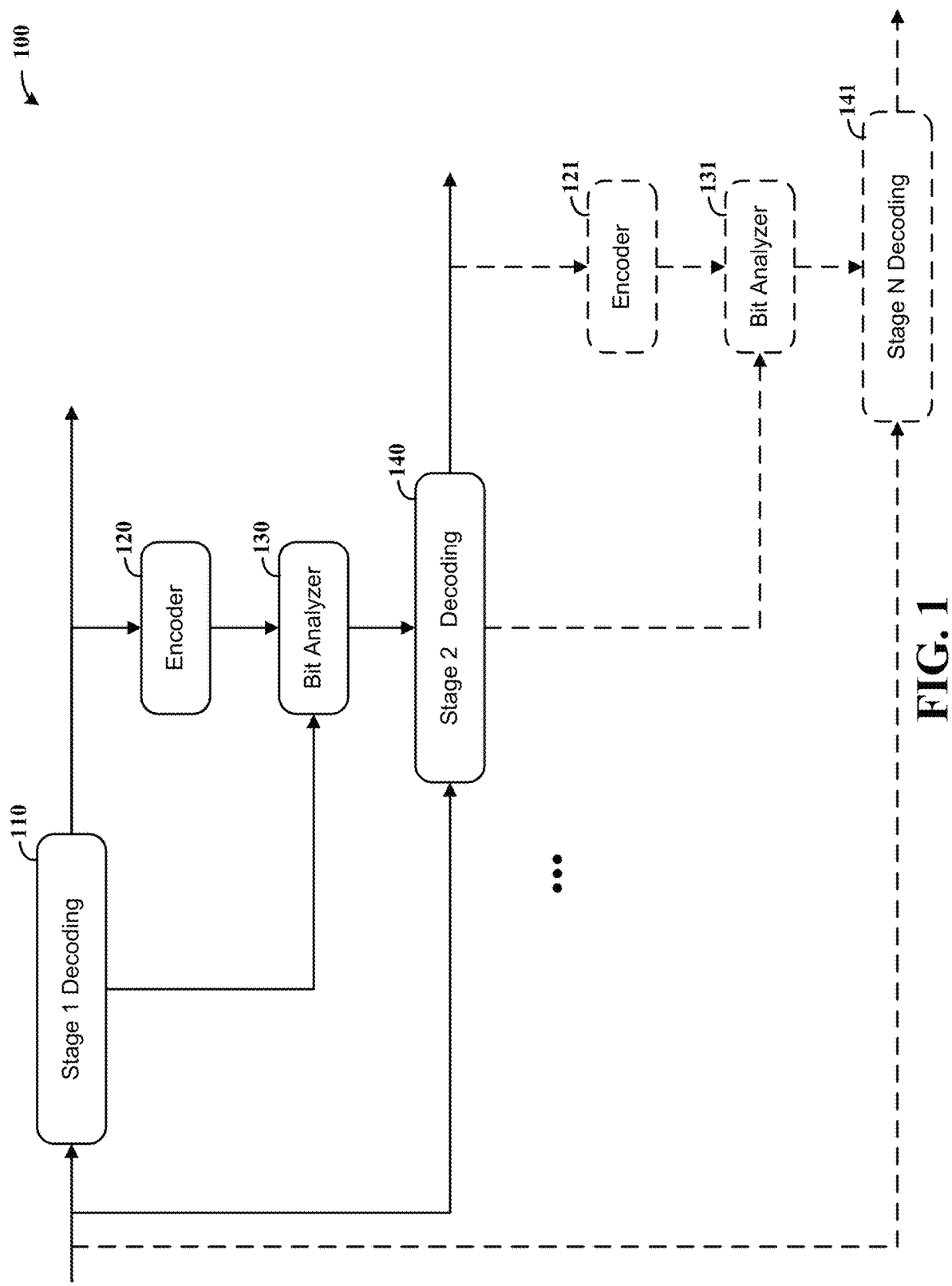
FIG. 1 shows a signal processing apparatus, as may be in accordance with aspects of the disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as may be used throughout this application is by way of illustration, and not limitation.

DETAILED DESCRIPTION

Aspects of the present disclosure are believed to be applicable to a variety of different types of apparatuses, systems and methods involving signal processing with error correction, in which assessed errors from a decoding process are used in a subsequent decoding process with error correction. In various aspects, the reliability of certain decoded bits can be assessed and used in the subsequent decoding process. Such approaches may, for example, facilitate the assessment of errors involving a limited number of bits in a signal, using the reliability characteristic to determine the bits on which to focus error correction. In certain implementations, aspects of the present disclosure have been shown to be beneficial when used in the context of iteratively decoding the same input signal. While not necessarily so limited, various aspects may be appreciated through a discussion of examples using such exemplary contexts.

According to various example embodiments, aspects of the present disclosure are directed to an iterative decoding scheme for concatenated coded systems, such as may be utilized in digital audio broadcast (DAB) systems, including the DAB+ family of standards, using convolutional codes with Reed-Solomon codes to improve reception quality. Such a DAB+ standard may include the ETSI standard EN 300 401, version 2.1.1 (2017 January). Concatenated error detecting/correcting codes are iteratively decoded, with feedback from a previous decoding used in a later decoding (e.g., as systematic bit log likelihood ratio (LLR) information for assessing bits). Such feedback may involve, for example, decoding a bit stream and assessing reliability/ performance of the decoding via approaches such as those involving a cyclic redundancy check (CRC) or RS decoding, and using the assessed reliability/performance as later decoding steps as additional systematic bit information. For instance, high reliability can be assessed to bits that pass a CRC check or to RS decoded bits, and such bits can be used as an extra systematic bit with LLR processing.

The embodiments characterized herein and otherwise applicable may be utilized in a variety of componentry and types of systems. For example, signal processing as characterized herein may be implemented with communication and broadcasting systems using concatenated coded systems, or any communication/broadcast system in which feedback indicative of reliability can be utilized for decoding. In this context, a forward error correction (FEC) block can access and utilize feedback for determining whether decoded packets are correct or not. Certain embodiments herein may be utilized with DAB+ systems, such as those in which data is encoded first with RS encoding, byte interleaved and coded with convolutional coding. Embodiments may also be utilized in concatenated schemes as may include convolutional codes with a CRC check, or low-density parity check (LDPC) codes with a Bose-Chaudhuri-Hocquenghem (BCH) code, CRC check or RS code. Further embodiments may utilize partial packet acknowledgement of a packet by a transmitter as an error detection scheme and used in a similar iterative decoder. These approaches may be used in various digital audio and video communications and/or broadcasting approaches. Such iterative decoding may employ underlying decoding methods, such as Viterbi, Reed Solomon or other soft/hard decoding methods, with feedback employed as characterized herein.

In certain embodiments involving a concatenated coded DAB+ system, a bit stream is encoded for transmission with RS coding, such as with shortened RS codes of (120,110) of shortened from RS(255,245) to (120,110). After RS encoding, the bit stream is interleaved, and bits are convolutionally coded with some polynomials (e.g., convolutional coded with polynomials [133 171] for DAB+ standard). At the receiver side, a baseband receiver computes the reliability of received encoded bits and feeds them to a decoder, such as a Viterbi decoder, which decodes the signal (in consideration of puncturing and polynomials used). The output bits are deinterleaved and fed to a RS decoder that decodes the RS encoded blocks. Information indicative as to whether the decoding is successful can then be used in one or more iterative decoding processes.

In various embodiments, iterative decoding is carried out in a manner that utilizes previous iterations to correct errors in instances where a limited number of byte errors may be corrected for a particular iteration. For instance, in DAB+, RS decoding may be used to correct up to 5 byte errors. Where more than 5 byte errors are present, iterative decoding can be implemented by utilizing an RS decoder to correct burst errors in an earlier iteration, followed by use of a Viterbi decoder with correct LLRs ascertained from the previous iteration. As the number of iterations increases, the number of correctable RS blocks can be increased as well.

Various embodiments are directed to methods and/or apparatuses as may be implemented for decoding signals susceptible to communication errors. An input signal is decoded to produce a first decoded output that is subsequently encoded and assessed for error characteristics. The input signal is then decoded again (e.g., the same signal, delayed), using the re-encoded output of the first decoded circuit and the assessed error characteristics to assess a reliability characteristic of bits in the input signal. A second decoded output is produced, with errors corrected therein based on the assessed reliability characteristic. This process can be iterated, correcting errors in the (same) input signal with improvement in each iteration. Information gleaned from earlier assessments is thus used to improve the error correction, which may address challenges such as those noted above.

The error characteristics can be assessed in a variety of manners. In some embodiments, a reliability metric is assigned to respective bits in the encoded first decoded output, in which the reliability metric for each bit is indicative of a likelihood that the bit in the encoded first decoded output is correct. Each bit in the input signal is then decoded again, based on the reliability metric assessed to the corresponding bit decoded in the first instance (e.g., using the metric and/or the decoded bit itself).

In other embodiments, error characteristics in the bits are assessed by identifying bits in the encoded first decoded output that are correct (or deemed correct), then using the identified bits as an indication of reliability of corresponding bits in the input signal. The input signal is then decoded again using identified bits as an indication of the reliability of corresponding bits in the input signal.

In a particular embodiment, the error characteristics of the encoded first decoded output are assessed as follows. A first value is assigned to bits determined to be correct and corresponding to a logic 1, and a second value is assigned to bits determined to be correct and corresponding to a logic 0. A neutral value is also assigned to bits that are not determined to be correct. The input signal is then re-decoded using the assigned values as an indication of reliability of corresponding bits in the input signal. In certain implementations, bits in the encoded first decoded output that are determined as being correct are selectively utilized for providing a decoded version of corresponding bits in the input signal.

Decoding is carried out in a variety of manners, to suit particular embodiments. In some embodiments, a concatenated decoding approach is used. For instance, such a concatenated decoding can be de-interleaved, and the first decoded output can be generated by decoding the de-interleaved concatenated decoding of the input signal with error-correction.

As may be implemented with the above or otherwise, the encoded first decoded output can be interleaved, and the second decoding involves using the interleaved encoded first decoded output.

The error characteristics of the encoded first decoded output can be assessed in one or more of a variety of manners. In some implementations, one or both of a cyclic redundancy check (CRC) and Reed-Solomon decoding are carried out. In certain implementations where bits in the encoded first decoded output are identified as correct, the input signal can be decoded again using those bits identified as correct in place of corresponding bits in the input signal (e.g., without performing error correction on those bits), and performing error correction on other bits in the input signal. This latter approach may, for example, facilitate use of a decoding process that is limited in its ability to correct a large number of bits, such that iterative decoding can focus on different bits.

Various methods/approaches characterized herein may be carried out using a variety of apparatuses with various componentry. In accordance with one or more embodiments, an apparatus for decoding signals susceptible to communication errors includes first and second decoders (decoder circuits), an encoder (circuit), and error assessment (logic) circuitry. The first decoder decodes an input signal and produce a first decoded output therefrom, and the encoder encodes the first decoded output. The error assessment circuitry assess error characteristics of the encoded first decoded output, for use by the second decoder, which decode the input signal (again) using the encoded first decoded output and the assessed error characteristics in order to assess a reliability characteristic of bits in the input signal. A second decoded output is thus produced, having errors corrected therein based on the assessed reliability characteristic.

Such circuitry may carry out various other functions as characterized herein, may be separated or combined with other circuitry, and generally utilize available components to achieve a result. In some embodiments, an apparatus as above also includes an interleaver circuit that interleaves the encoded first decoded output, which the second decoder then uses in decoding the input signal.

Turning now to the figures, FIG. 1 shows a signal processing apparatus 100, as may be in accordance with aspects of the disclosure. The apparatus 100 is shown with two iterative decoding stages, but may be implemented with up to "N" (e.g., three or more) such stages. At block 110, stage 1 decoding is carried out upon an input signal. The decoded signal is re-encoded at block 120 and bits in the re-encoded signal are analyzed at block 130, using the initial decoding from block 110 as an input. The output from the bit analyzer 130 is used for stage 2 decoding at block 140, facilitating error correction with increased reliability (e.g., relative to stage 1 decoding at block 110). The input signal received at stage 2 decoding block 140 may, for example, be delayed to provide time for the processes carried out at blocks 110, 120 and 130, such that the same signal is being decoded at block 140.

Where further iterations are desired, encoder block 121 re-encodes the signal decoded at block 140, and bit analyzer 131 assesses reliability of the signal re-encoded at encoder 121 with the input from stage 2 decoding at block 140. The output of the bit analyzer 131 is provided for "stage N" decoding at block 141, which utilizes the same input signal (e.g., as delayed) as provided in both state 1 decoding and stage 2 decoding.

Figure 2:
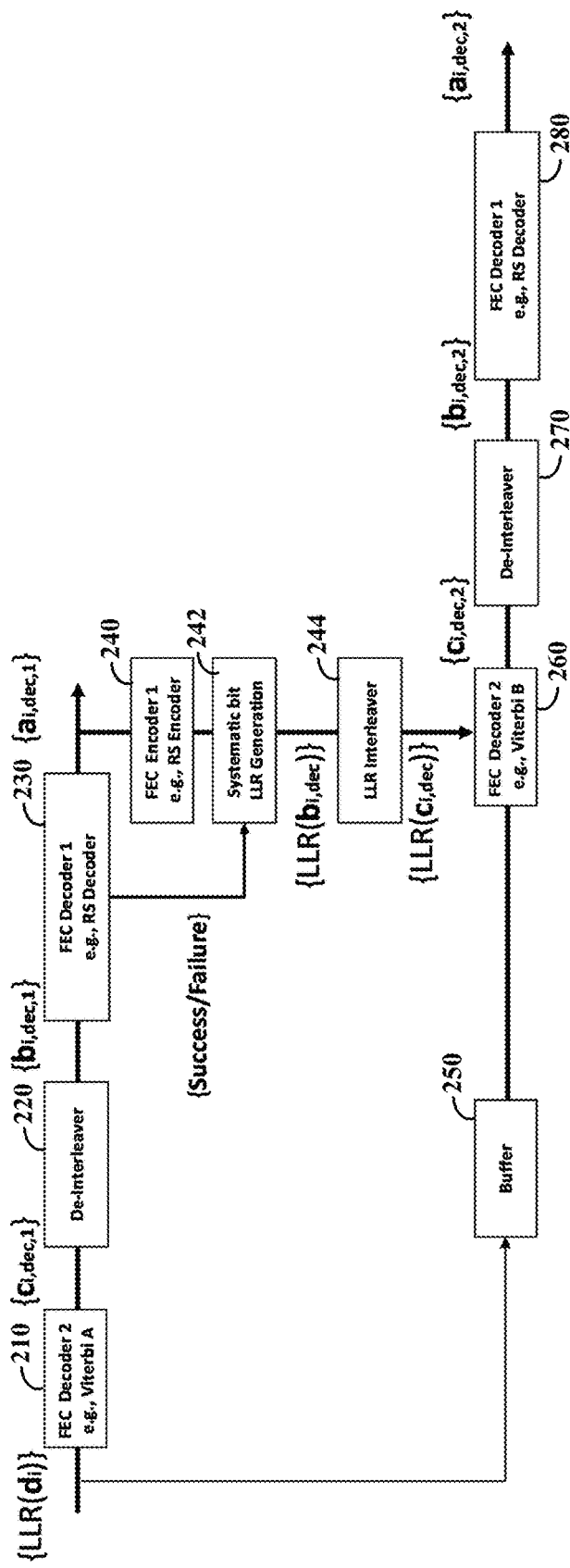
FIG. 2 shows another signal processing apparatus, as may be in accordance with aspects of the disclosure.

FIG. 2 shows another signal processing apparatus 200, as may be in accordance with aspects of the disclosure. Iterative decoding is carried out for concatenated codes as follows. A receiver first decodes a bit stream, with FEC decoding at block 210 (e.g., Viterbi decoding), de-interleaving at block 220, and FEC decoding at block 230 (e.g., RS decoding). After RS decoding, the decoded RS packets are FEC encoded at block 240 and sent to a systematic bit LLR generation block 242, which generates the LLRs for systematic bits using an output of the FEC decoder 230 as an input. For instance, an LLR of value −Lmax can be generated if the bit can be decoded successfully and it is a 0, an LLR of value Lmax can be generated if the bit can be decoded successfully and it is a 1, and an LLR of value 0 can be generated if the RS packet cannot be decoded successfully. The −Lmax, Lmax, and neutral LLR value may depend on how the FEC decoder of an iterative step is configured for using the most reliable 0 bit, 1 bit and neutral bit, respectively.

LLRs generated at block 242 are interleaved and sent to a further stage FEC decoder 260 (e.g., a Viterbi decoder), which decodes the input signal as passed via a buffer 250, using the LLRs as inputs. The output of FEC decoder 260 is then passed to a de-interleaver 270, and the de-interleaved output thereof is passed to a further FEC decoder 280 (e.g., a RS decoder).

The FEC decoder 260 may operate differently than the FEC decoder 210. For instance, FEC decoder 210 may decode a coded stream coded with an original mother code defined in a communication standard, such as the DAB+ standard. The FEC decoder 260 decodes a coded stream with systematic bits, which provides it with an extra bit stream coming from the LLR interleaver 244.

Figure 3:
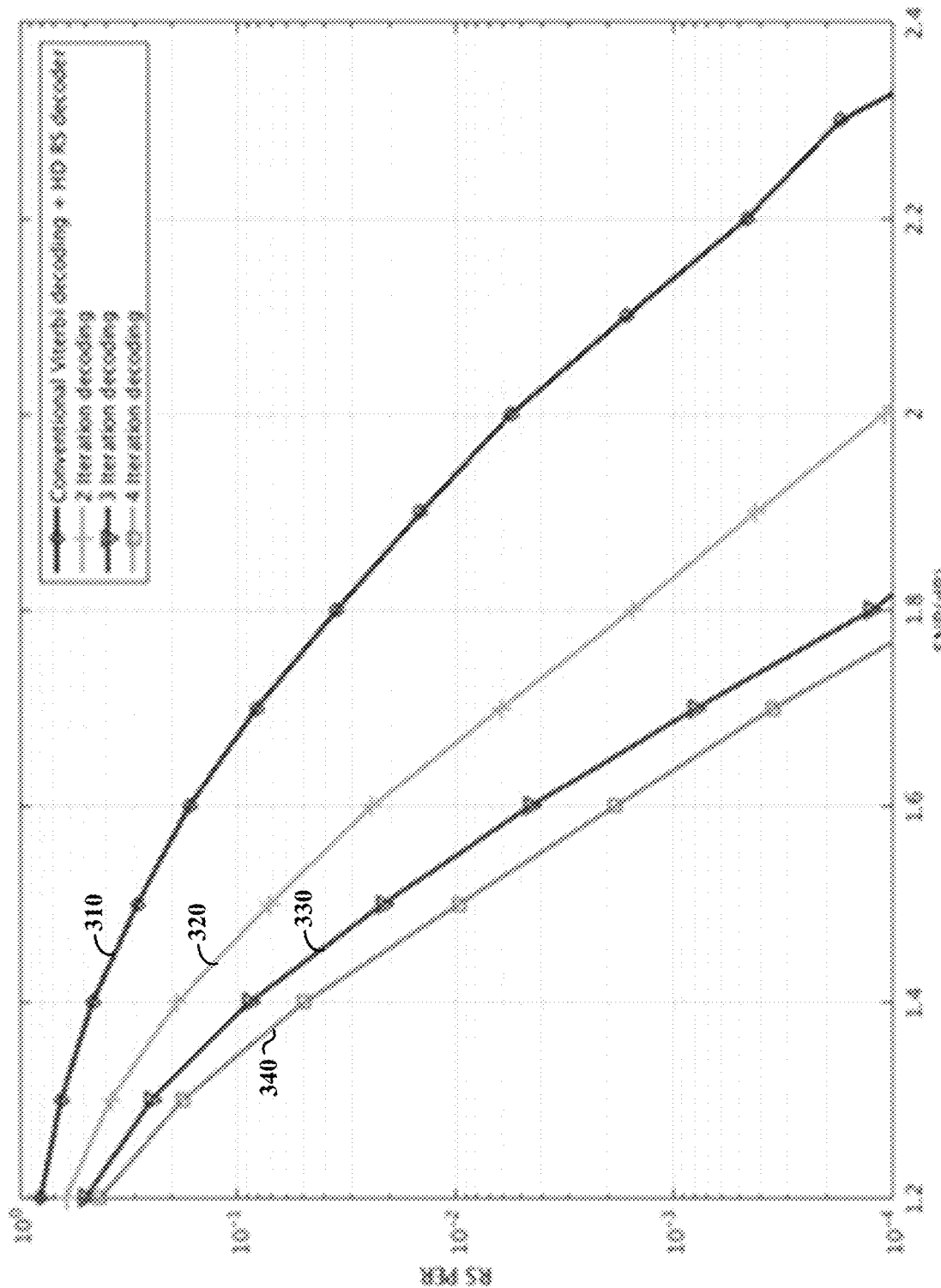
FIG. 3 shows a plot of signal to noise ratio, as may be achieved in accordance with one or more embodiments.
Figure 4:
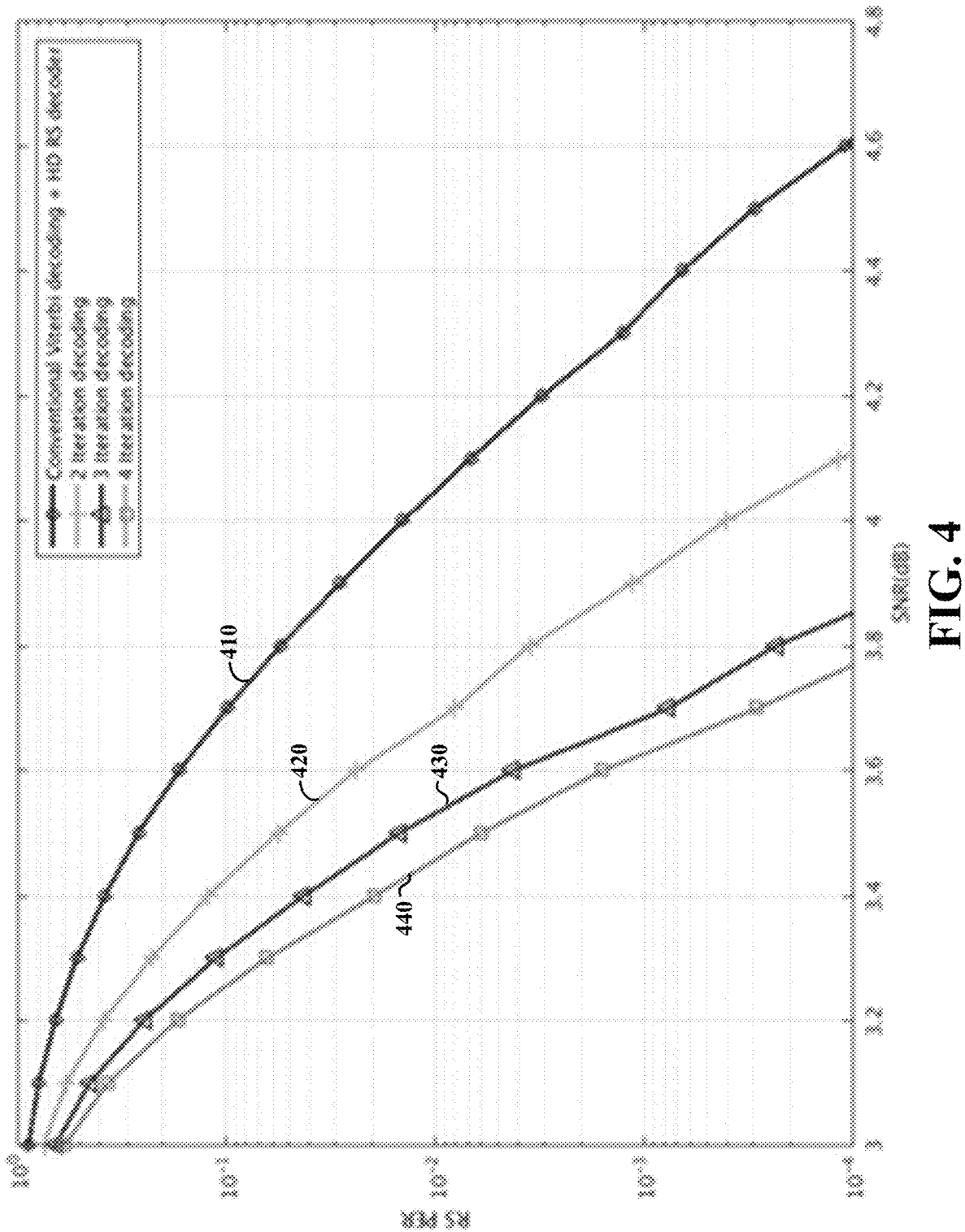
FIG. 4 shows a plot of signal to noise ratio, as may be achieved in accordance with one or more embodiments.

FIGS. 3 and 4 show plots of signal to noise ratio for a decoding approach as may be implemented in accordance with one or more embodiments. In particular, FIG. 3 shows RS performance in an added white Gaussian noise (AWGN) channel, and FIG. 4 shows RS performance in a Rayleigh fading channel (e.g., for BPSK modulated signals and concatenated coding of RS (120,100) and CC (133, 171) as defined in the DAB+ standard). In FIG. 3, plot 310 shows Viterbi decoding with an HD RS decoder, and plots 320, 330 and 340 respectively show second, third and further iterations of such decoding utilizing aspects of the present disclosure, with approximately 0.5 dB gain in a few iterations. In FIG. 4, plot 410 shows Viterbi decoding with an HD RS decoder, and plots 420, 430 and 440 respectively showing second, third and further iterations of such decoding utilizing aspects of the present disclosure, with approximately 0.8 dB gain.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., encoding, bit analyzing, interleaving/de-interleaving, or decoding). For example, in certain of the above-discussed embodiments, one or more modules are discrete logic circuits or programmable logic circuits configured and arranged for implementing these operations/activities, as in the circuit modules shown in FIG. 1 or 2. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, various types of feedback from earlier iterations can be used to assess reliability characteristics, which may be different than the reliability aspects characterized herein, and used to improve subsequent iterative decoding. Such modifications do not depart from the true spirit and scope of various aspects of the invention, including aspects set forth in the claims.

What is claimed is:

1. A method for decoding signals susceptible to communication errors, the method comprising:

decoding an input signal via logic circuitry and producing a first decoded output therefrom;
encoding the first decoded output;
assessing error characteristics of the encoded first decoded output; and
decoding the input signal by using the encoded first decoded output and the assessed error characteristics thereof to assess a reliability characteristic of bits in the input signal, and producing a second decoded output having errors corrected therein based on the assessed reliability characteristic.

2. The method of claim 1, wherein
assessing the error characteristics includes assigning a reliability metric to respective bits in the encoded first decoded output, the reliability metric being indicative of a likelihood of the respective bits in the encoded first decoded output being correct, and
decoding the input signal by using the encoded first decoded output and the assessed error characteristics thereof includes using bits in the encoded first decoded output based on the reliability metric assessed to the bits.

3. The method of claim 1, wherein
assessing the error characteristics includes identifying bits in the encoded first decoded output as correct, and
decoding the input signal by using the encoded first decoded output and the assessed error characteristics thereof includes using the identified bits as an indication of the reliability of corresponding bits in the input signal.

4. The method of claim 1, wherein
assessing the error characteristics of the encoded first decoded output includes:
assigning a first value to bits determined to be correct and corresponding to a logic 1,
assigning a second value to bits determined to be correct and corresponding to a logic 0, and
assigning a neutral value to bits that are not determined to be correct; and
wherein decoding the input signal by using the encoded first decoded output and the assessed error characteristics includes using the assigned values as an indication of reliability of corresponding bits in the input signal.

5. The method of claim 4, further including selectively utilizing bits in the encoded first decoded output determined as being correct for providing a decoded version of corresponding bits in the input signal.

6. The method of claim 1, wherein decoding the input signal includes using concatenated decoding.

7. The method of claim 1, wherein decoding the input signal and producing the first decoded output therefrom includes:
performing a concatenated decoding of the input signal;
de-interleaving the concatenated decoding of the input signal; and
providing the first decoded output by decoding the de-interleaved concatenated decoding of the input signal with error-correction.

8. The method of claim 1, wherein assessing the error characteristics of the encoded first decoded output includes performing one or both of a cyclic redundancy check (CRC) and Reed-Solomon decoding.

9. The method of claim 1, further including interleaving the encoded first decoded output, wherein decoding the input signal by using the encoded first decoded output and the assessed error characteristics includes using the interleaved encoded first decoded output.

10. The method of claim 1, wherein
assessing the error characteristics includes identifying bits in the encoded first decoded output as correct, and
decoding the input signal by using the encoded first decoded output and the assessed error characteristics includes using the bits in the encoded first decoded output identified as correct in place of corresponding bits in the input signal and performing error correction on other bits in the input signal.

11. An apparatus for decoding signals susceptible to communication errors, the apparatus comprising:
a first decoder circuit including logic circuitry configured and arranged to decode an input signal and produce a first decoded output therefrom;
an encoder circuit configured and arranged to encode the first decoded output;
logic circuitry configured and arranged to assess error characteristics of the encoded first decoded output; and
a second decoder circuit configured and arranged to decode the input signal by using the encoded first decoded output and the assessed error characteristics thereof to assess a reliability characteristic of bits in the input signal, and to produce a second decoded output having errors corrected therein based on the assessed reliability characteristic.

12. The apparatus of claim 11, wherein
the logic circuitry is configured and arranged to assess the error characteristics by assigning a reliability metric to respective bits in the encoded first decoded output, the reliability metric being indicative of a likelihood of the respective bits in the encoded first decoded output being correct, and
the second decoder circuit is configured and arranged to decode the input signal by using bits in the encoded first decoded output based on the reliability metric assessed to the bits.

13. The apparatus of claim 11, wherein
the logic circuitry is configured and arranged to assess the error characteristics by identifying bits in the encoded first decoded output as correct, and
the second decoder circuit is configured and arranged to decode the input signal by using the identified bits as an indication of the reliability of corresponding bits in the input signal.

14. The apparatus of claim 11, wherein
the logic circuitry is configured and arranged to assess the error characteristics by:
assigning a first value to bits determined to be correct and corresponding to a logic 1,
assigning a second value to bits determined to be correct and corresponding to a logic 0, and
assigning a neutral value to bits that are not determined to be correct; and
wherein the second decoder circuit is configured and arranged to decode the input signal by using the assigned values as an indication of reliability of corresponding bits in the input signal.

15. The apparatus of claim 14, wherein the second decoder circuit is configured and arranged to decode the input signal by selectively utilizing bits in the encoded first decoded output determined as being correct for providing a decoded version of corresponding bits in the input signal.

16. The apparatus of claim 11, wherein the first and second decoder circuits are configured and arranged to decode the input signal by using concatenated decoding.

17. The apparatus of claim 11, wherein the first decoder circuit is configured and arranged to decode the input signal and produce the first decoded output therefrom by:
   performing a concatenated decoding of the input signal;
   de-interleaving the concatenated decoding of the input signal; and
   providing the first decoded output by decoding the de-interleaved concatenated decoding of the input signal with error-correction.

18. The apparatus of claim 11, wherein the logic circuitry is configured and arranged to assess the error characteristics by performing one or both of a cyclic redundancy check (CRC) and Reed-Solomon decoding.

19. The apparatus of claim 11, further including an interleaver circuit configured and arranged to interleave the encoded first decoded output, wherein the second decoder circuit is configured and arranged to decode the input signal using the interleaved encoded first decoded output.

20. The apparatus of claim 11, wherein
   the logic circuitry is configured and arranged to assess the error characteristics by identifying bits in the encoded first decoded output as correct, and
   the second decoder circuit is configured and arranged to decode the input signal by using the bits in the encoded first decoded output identified as correct in place of corresponding bits in the input signal, and performing error correction on other bits in the input signal.

* * * * *